United States Patent
Lin et al.

(10) Patent No.: US 6,177,336 B1
(45) Date of Patent: Jan. 23, 2001

(54) METHOD FOR FABRICATING A METAL-OXIDE SEMICONDUCTOR DEVICE

(75) Inventors: Tony Lin, Kao Hsiung Hsien; Wen-Kuan Yeh, Chupei; Coming Chen, Taoyuan Hsien; Jih-Wen Chou, Hsinchu, all of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/187,245

(22) Filed: Nov. 6, 1998

(30) Foreign Application Priority Data

Sep. 5, 1998 (TW) .................................. 97114762

(51) Int. Cl.⁷ .............................................. H01L 21/4763
(52) U.S. Cl. .................... 438/592; 438/305; 438/655; 438/682
(58) Field of Search ..................... 438/296, 305, 438/306, 307, 424, 437, 532, 533, 586, 592, 655, 682

(56) References Cited

U.S. PATENT DOCUMENTS

| | | | |
|---|---|---|---|
| 5,731,239 | * 3/1998 | Wong et al. | 438/296 |
| 5,840,609 | * 11/1998 | Hyeon et al. | 438/299 |
| 5,950,090 | * 9/1999 | Chen et al. | 438/296 |
| 6,001,698 | * 12/1999 | Kuroda | 438/303 |

* cited by examiner

Primary Examiner—Charles Bowers
Assistant Examiner—Thanh Nguyen
(74) Attorney, Agent, or Firm—Hickman Coleman & Hughes, LLP

(57) ABSTRACT

A method for fabricating a metal-oxide semiconductor (MOS) transistor is provided. The method has steps of sequentially forming an oxide layer, a polysilicon layer and a cap layer on a semiconductor substrate to form a first-stage gate. An interchangeable source/drain region with a lightly doped drain (LDD) structure is formed in the substrate at each side of the first-stage gate. An insulating layer is formed over the substrate, and is planarized so as to exposed the cap layer. Removing the exposed cap layer forms an opening that exposes the polysilicon layer. Using the insulating layer as a mask, a self-aligned selective local implantation process is performed to form a threshold-voltage doped region and an anti-punch-through doped region below the oxide layer in the substrate. A conductive layer is formed over the substrate to fill the opening. A chemical mechanical polishing process is performed to expose the insulating layer so that a remaining portion of the conductive layer fills the opening to form together with the polysilicon layer and the oxide layer to serve as an gate structure.

20 Claims, 5 Drawing Sheets

METHOD FOR FABRICATING A METAL-OXIDE SEMICONDUCTOR DEVICE

BACKGROUND OF THE INVENTION

1. Field of the Invention

This invention relates to semiconductor fabrication, and more particularly to a method for fabricating a metal-oxide semiconductor device (MOS) device.

2. Description of Related Art

A MOS device is the most elementary device in a integrated circuit (IC) device. A MOS transistor usually includes a gate structure, a source region, and a drain region. The gate structure further includes a gate oxide layer and a metal layer sequentially formed on a semiconductor substrate, such as a silicon substrate. The source region and the drain region are formed in the semiconductor substrate respectively at each side of the gate structure. Since the source region and the drain region is interchangeable, the source region drain region are usually called together as an interchangeable source/drain region.

Conventionally, before forming the gate structure of the MOS transistor, a global ion implantation process is necessarily performed over the semiconductor substrate so as to adjust a threshold voltage of the gate structure and form a capability of anti-punch-through. The gate structure, the source region and the drain region are then formed to accomplish the MOS transistor. The conductive layer of the gate structure usually includes a doped polysilicon layer and a metal silicide layer, which is also called a silicide layer. The polysilicon layer provides a better adhesion capability with the gate oxide layer, and the suicide layer provides a better conductivity. Combining these two layers, the metal layer of the gate structure is called a polycide layer.

In above, even through the global ion implantation process has its advantages, it also causes an extra junction capacitance of the source/drain region, resulting a larger AC resistance, which decreases a data transmission speed. Moreover, as the device integration continuously increases, the device dimension has reached to a deep sub-micron level. The conventional polycide layer of the gate structure therefore has larger resistance due to a reduced dimension. This also causes to decrease the data transmission speed. Furthermore, for a dual gate structure, which includes two gate structures abutting each other, the dopants of the doped polycide layers of each gate structure may inter-diffuse each other through the silicide layers of the dual gate structure, resulting in a drifting of the threshold voltage. Moreover, the silicide layers may be agglomerated as an annealing process is performed in a high temperature environment. The agglomeration phenomenon causes an instability of electrical properties of the gate structure. A conventional solution, called a selective local implantation process, to solve the above problems is proposed to take place of the global ion implantation process. A metal gate layer also takes place of the conventional silicide layer of the polycide gate structure. The conventional proposal is described in FIGS. 1A–1D, which are cross-sectional views of a MOS transistor, schematically illustrating a conventional fabrication process of the MOS transistor.

In FIG. 1A, a semiconductor substrate 100 including a trench isolation structure 102 is provided. A photoresist layer 104 is formed on the substrate 100 and is patterned to expose a portion of the substrate 100, where a gate structure is to be formed. Using the photoresist layer 104 as a mask, ion implantation processes are performed to form a threshold-voltage doped region 116a and an anti-punch-through region 116b in the substrate 100 below the threshold-voltage doped region 116a.

In FIG. 1B, after removing the photoresist layer 104, a gate oxide layer 106, a polysilicon layer 108, and a metal layer 110 are sequentially formed over the substrate 100.

In FIG. 1C, the gate oxide layer 106, the polysilicon layer 108, and the metal layer 110 are patterned to respectively form a gate oxide layer 106a, a polysilicon layer 108a, and a metal layer 110a, all of which form a gate structure 109, which is above the threshold-voltage doped region 116a.

In FIG. 1D, a light ion implantation is performed to pre-form an interchangeable source/drain region between the gate structure 109 and the trench isolation structure 102. A sidewall spacer 112 is formed on each sidewall of the gate structure 109. Using the sidewall spacer 112 and the gate structure 109 as a mask, a heavy ion implantation is performed to accomplish an interchangeable source/drain region 114 in the substrate 100 at each side of the gate structure 109. A MOS transistor with the selective local implantation process is therefore formed. The interchangeable source/drain region 114 has lightly doped drain (LDD) structure. The metal layer 110a in the gate structure 109 can solve those conventional issues of high gate resistance, polycide thermal instability, and inter-diffusion. The MOS transistor with the selective local implantation process can reduce the junction capacitance in order to increase operation of data transmission speed.

However, the metal layer 110 cannot be easily etched, and the etched metal particles from the metal layer 110 remaining a etching tank may cause an acid-tank contamination. A contaminated etching tank may affect subsequent etching performance. Moreover, the selective local implantation process needs an extra mask, which also needs a critical alignment accuracy. A low yield rate may occurs.

SUMMARY OF THE INVENTION

It is therefore an objective of the present invention to provide a method for fabricating a MOS transistor so as to solve avoid an extra mask for performing a selective local implantation. An alignment inaccuracy from the extra mask is avoided.

It is another an objective of the present invention to provide a method for fabricating a MOS transistor so as to solve the issue of a difficulty of etching a metal layer included in a gate structure, and avoid an acid-tank contamination resulting from the etching process on the metal layer.

In accordance with the foregoing and other objectives of the present invention, an improved method for fabricating a MOS transistor is provided. The improved method includes sequentially forming an oxide layer, a polysilicon layer and a cap layer on a semiconductor substrate to form a first-stage gate. An interchangeable source/drain region with a lightly doped drain (LDD) structure is formed in the substrate at each side of the first-stage gate, in which a sidewall spacer is also formed on each sidewall of the first-stage structure. An insulating layer is formed over the substrate, and is planarized so as to exposed the cap layer. Removing the exposed cap layer forms an opening that exposes the polysilicon layer. Using the insulating layer as a mask, a self-aligned selective local implantation process is performed to form a threshold-voltage doped region and an anti-punch-through doped region below the oxide layer in the substrate. The self-aligned selective local implantation process needs no an extra mask and its alignment so that fabrication difficulty of accuracy and fabrication cost are effectively reduced.

A conductive layer, such as a metal layer, is formed over the substrate to fill the opening. A planarization process, such as a chemical mechanical polishing (CMP) process, is performed to expose the insulating layer so that a remaining portion of the conductive layer fills the opening to form together with the polysilicon layer and the oxide layer to serve as an gate structure. Since the conductive layer is formed without including an etching process. There are no issues of difficult etching on the metal layer and acid-tank contamination during etching the metal layer, which issues may occurs in a conventional fabrication method.

In the foregoing, the interchangeable source/drain region may also include a formation of a self-aligned silicide (Salicide) layer on its top, and a formation of a barrier layer between the metal layer and the polysilicon layer.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1A:
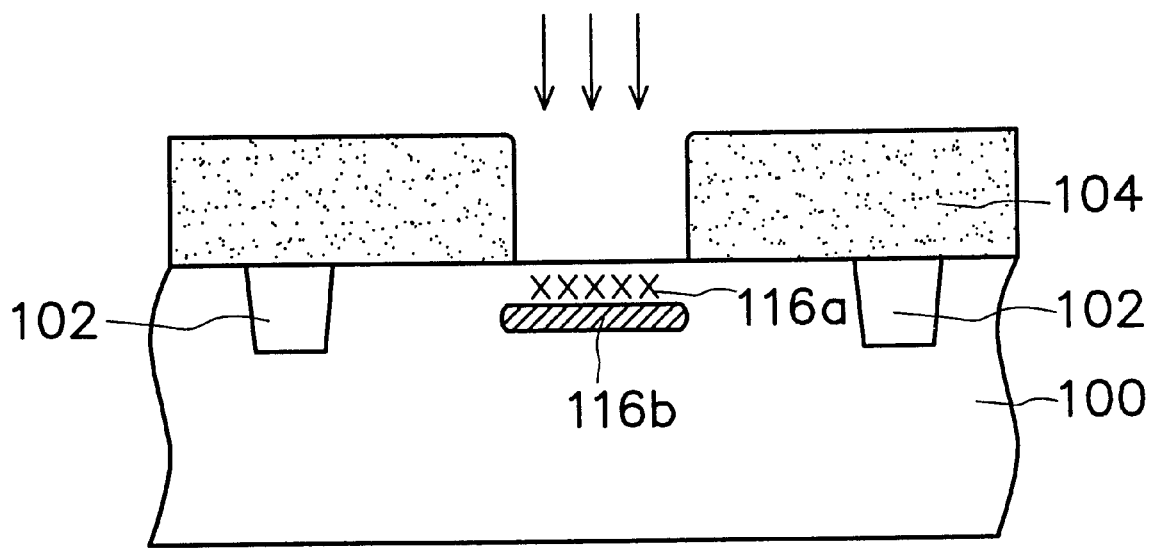
FIGS. 1A–1D are cross-sectional views of a MOS transistor, schematically illustrating a conventional fabrication process of the MOS transistor.
Figure 1B:
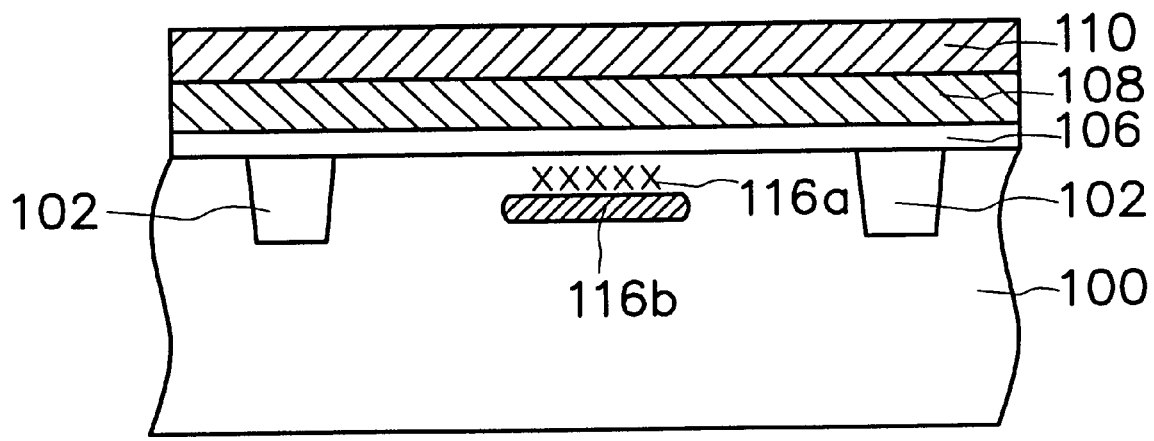
Figure 1C:
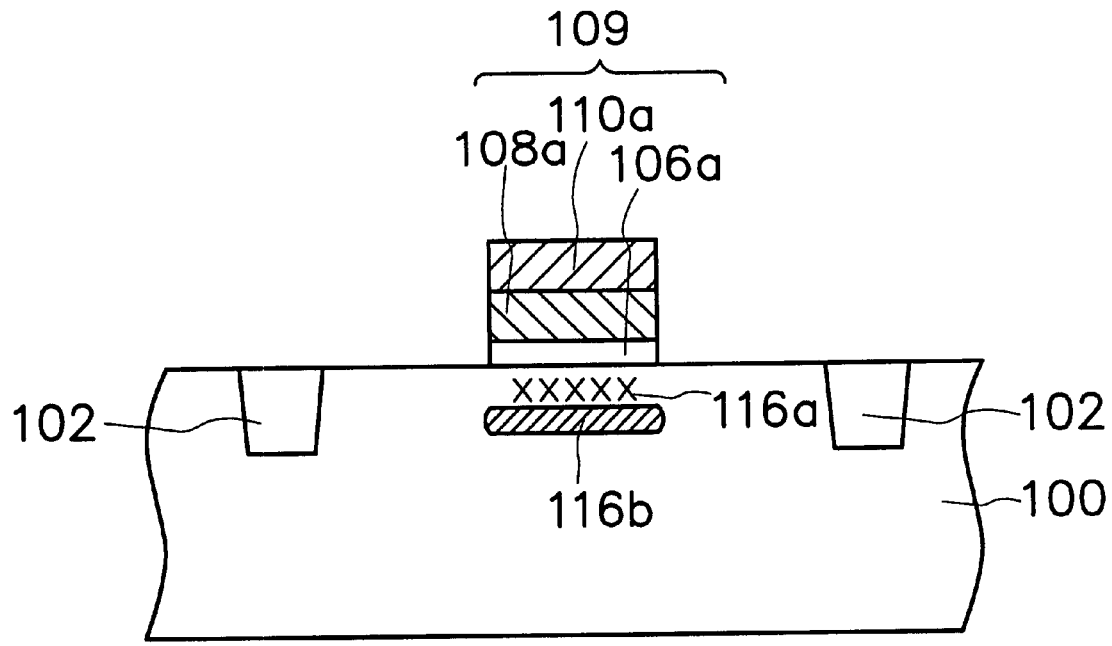
Figure 1D:
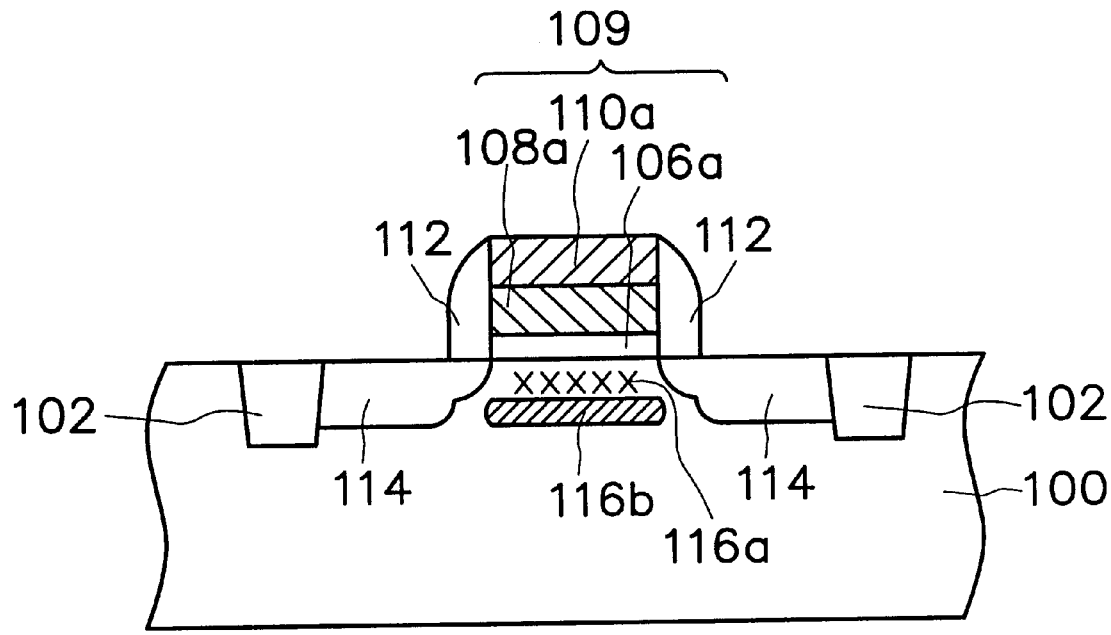
Figure 2A:
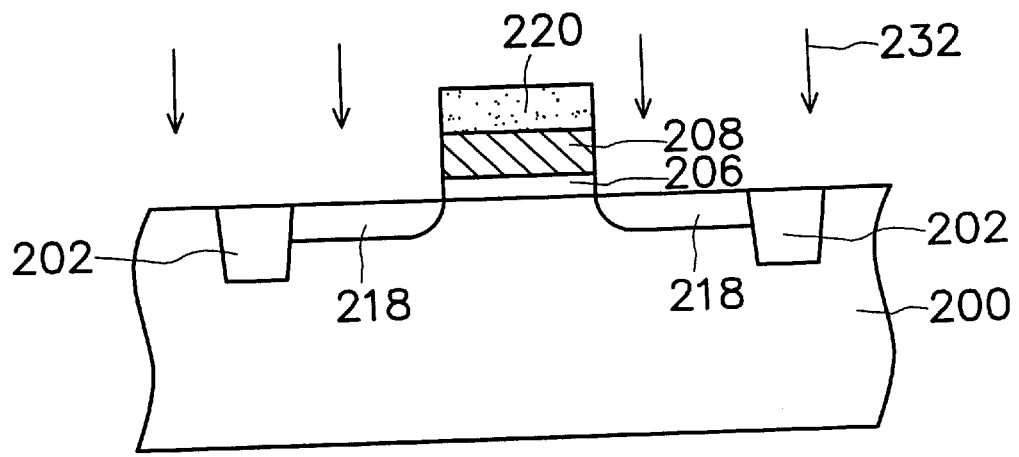
FIGS. 2A–2G are cross-sectional views of a MOS transistor on a portion of a semiconductor substrate, schematically illustrating a fabrication process of the MOS transistor, according to a preferred embodiment of the invention.
Figure 2B:
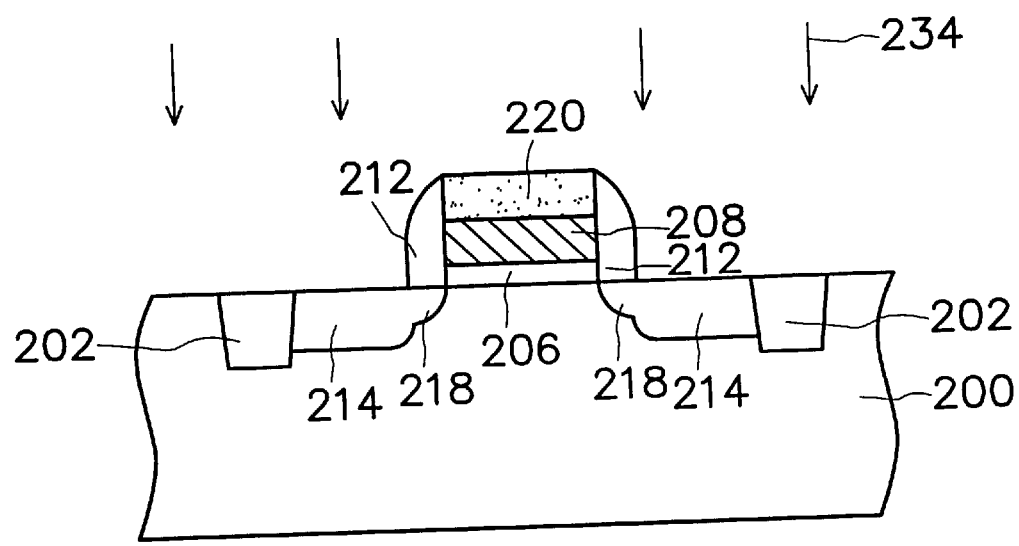

FIGS. 2A–2G are cross-sectional views of a MOS transistor on a portion of a semiconductor substrate, schematically illustrating a fabrication process of the MOS transistor, according to a preferred embodiment of the invention. In FIG. 2A, a substrate 200 is provided. An isolation structure 202, such as a shallow trench isolation (STI) structure is formed in the substrate 200. The STI structure cal also, for example, replaced by a field oxide layer formed through a local oxidation (LOCOS) process. A first-stage gate structure including a gate oxide layer 206, a polysilicon layer 208, and a cap layer 220 is formed on the substrate between each STI structure 202. The first-stage gate structure can be formed, for example, by sequentially forming a gate oxide layer, a polysilicon layer, and a cap layer over the substrate 200 and patterning these three layers. A lightly doping process 232 preferably performed to form a lightly doped region 218 at each side of the first-stage gate structure in the substrate 200. The cap layer 220 includes, for example silicon nitride or nitrogen silicon oxide, and is formed by chemical vapor deposition (CVD). A low pressure CVD (LPCVD) is preferably used. The lightly dope region 218 including a dosage density of about $10^{13}$ atoms/cm$^2$ is used to solve short channel effects occurring on the junction region In FIG. 2B, a spacer 212 is formed on each sidewall of the first-stage gate. Using the spacer 212 and the cap layer 220 as a mask a heavily doping process 234 is performed to form a heavily doped region 214 on the lightly doped region 218. An interchangeable source/drain region 214 is formed, which includes the lightly doped region 218, or called a lightly doped drain (LDD) structure. The spacer 212 includes silicon oxide or silicon nitride. The interchangeable source/drain region 214 has a dosage density of about $10^{15}$ atoms/cm$^2$ implanted with a beam energy of about 100 KeV or less.

Figure 2C:
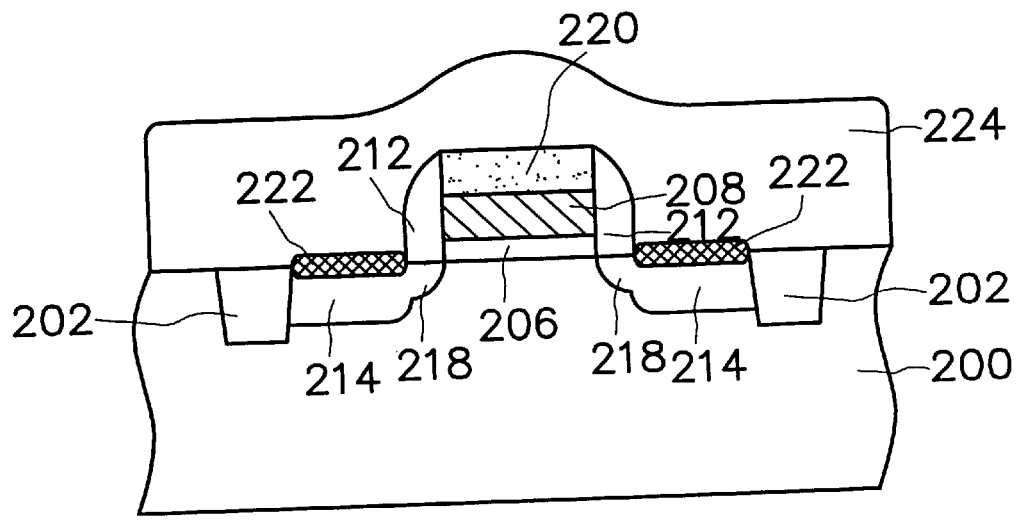

In FIG. 2C, a self-aligned silicide (Salicide) process is performed to form a Salicide layer 222 on the interchangeable source/drain region 214. The Salicide process includes, for example, forming a metal layer 218 (not shown) over the substrate, performing a thermal process with a sufficiently high temperature to cause a reaction between the metal layer and silicon in the substrate 200. After removing the metal layer without reaction, the Salicide layer 222 is formed on the interchangeable source/drain region 214 so as to reduce sheet resistance. The metal layer include, for example, titanium. An insulating layer 224 is formed over the substrate 200. The insulating layer 224 includes a material having a good etching selectivity between the cap layer and the insulating layer. The insulating layer 224 preferably includes silicon oxide and is formed by LPCVD or plasma enhanced CVD (PECVD).

Figure 2D:
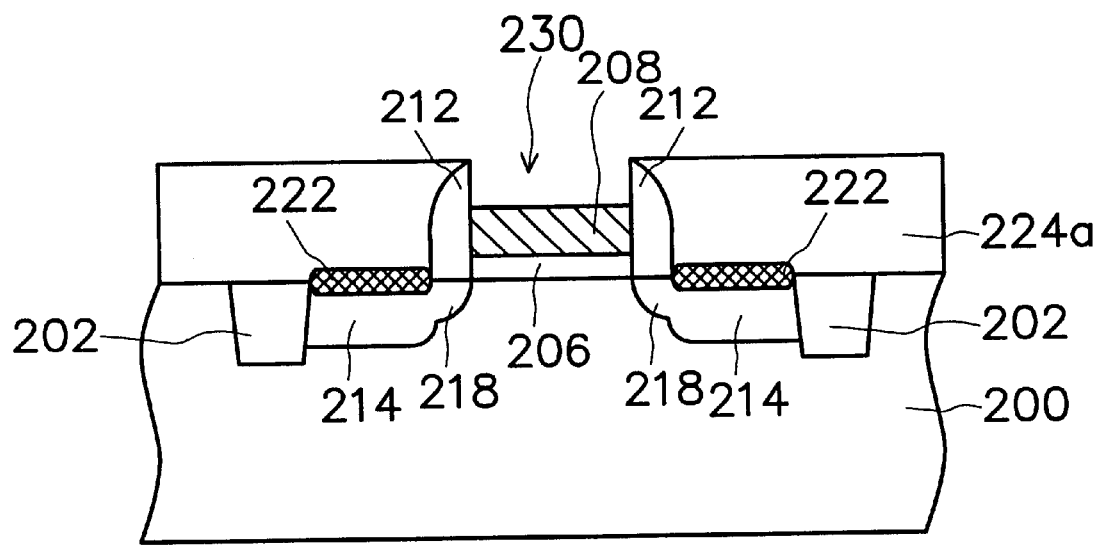

In FIG. 2D, a planarization process is performed to planarize the insulating layer 224 so that the cap layer 220 of FIG. 2C is exposed and the insulating layer 224 becomes an insulating layer 224a. Since the etching selectivity between the cap layer and the insulating layer 224a is different, the cap layer 220 is removed by, for example, etching to form an opening 230, which exposes the polysilicon layer 208. The planarization includes, for example, a chemical mechanical polishing (CMP) process, using the cap layer as a polishing stop point.

Figure 2E:
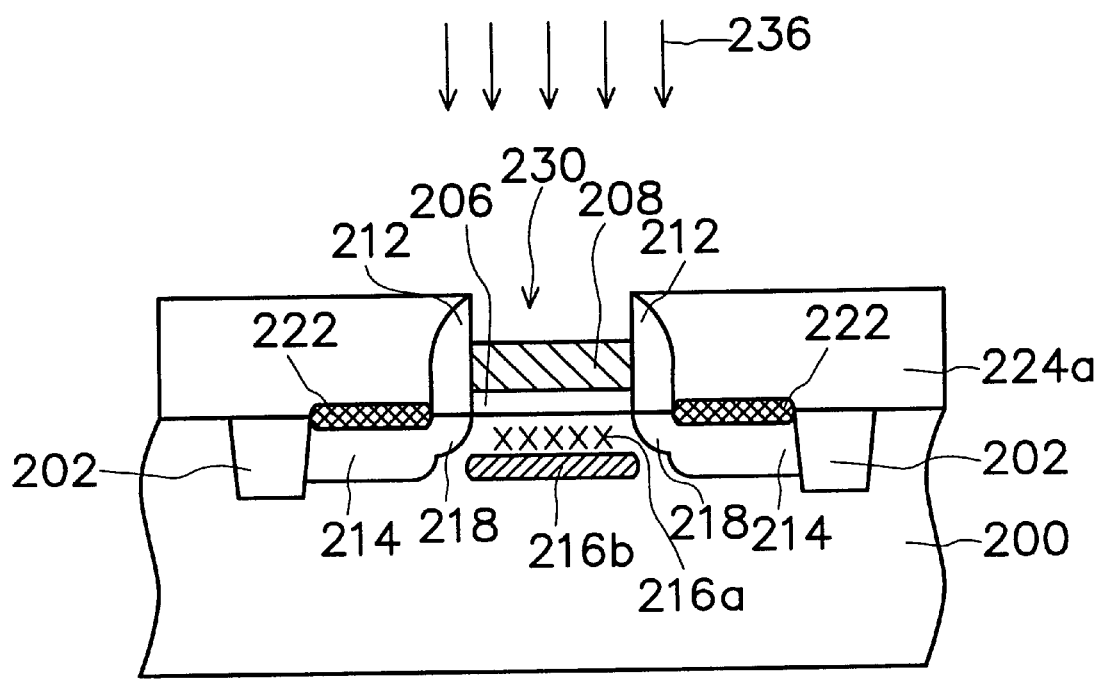

In FIG. 2E, using the insulating layer 224a as a self-aligned mask, a self-aligned selective local implantation process 236 is performed to form a threshold-voltage doped region 216a and an anti-punch-through doped region 216b in the substrate 200. The threshold-voltage doped region 216a used to adjust the gate threshold voltage has a dosage density of about $10^{12}$ atoms/cm$^2$ with an ion energy of about a few ten KeV. The threshold-voltage doped region 216a is formed by self-aligned selective local implantation process without using an extra mask so that the fabrication cost decreases and an alignment inaccuracy is not further induced. This allows a gate to be more precisely formed later above the threshold-voltage doped region 216a.

Figure 2F:
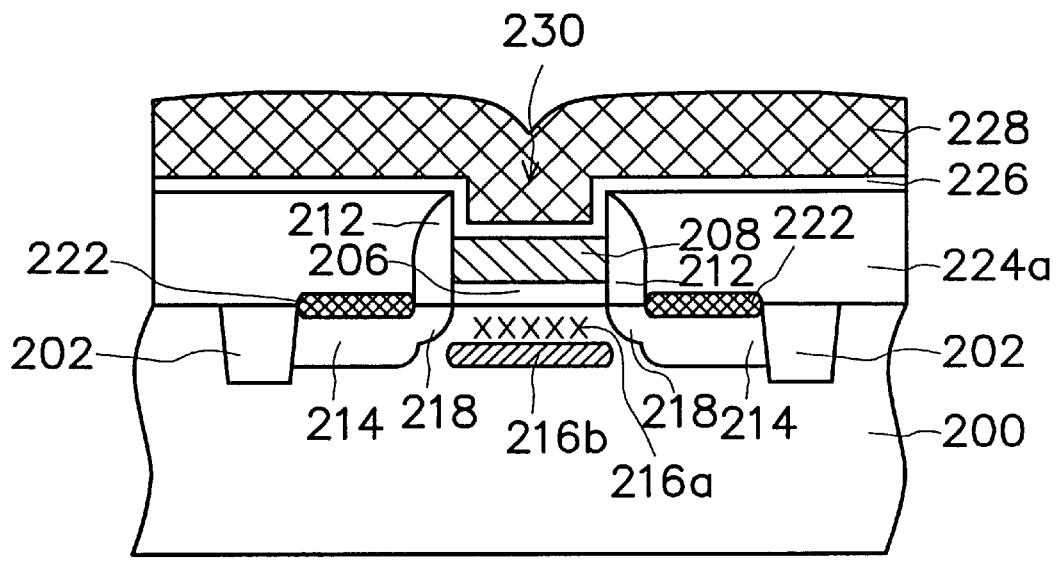

In FIG. 2F, a barrier layer 226, conformal to top surface of the substrate 200, is formed over the substrate 200. A conductive layer 228 is formed on the barrier layer 226 to fill the opening 230. The barrier layer 226 can prevent the implanted ions for the threshold-voltage doped region 216a from diffusing into the conductive layer 228. Several materials are available to be chosen. For example, if the conductive layer 228 includes copper, the barrier layer 226 preferably includes Ta/TaN, or if the conductive layer 228 includes tungsten, the barrier layer 226 preferably includes Ti/TiN.

Figure 2G:
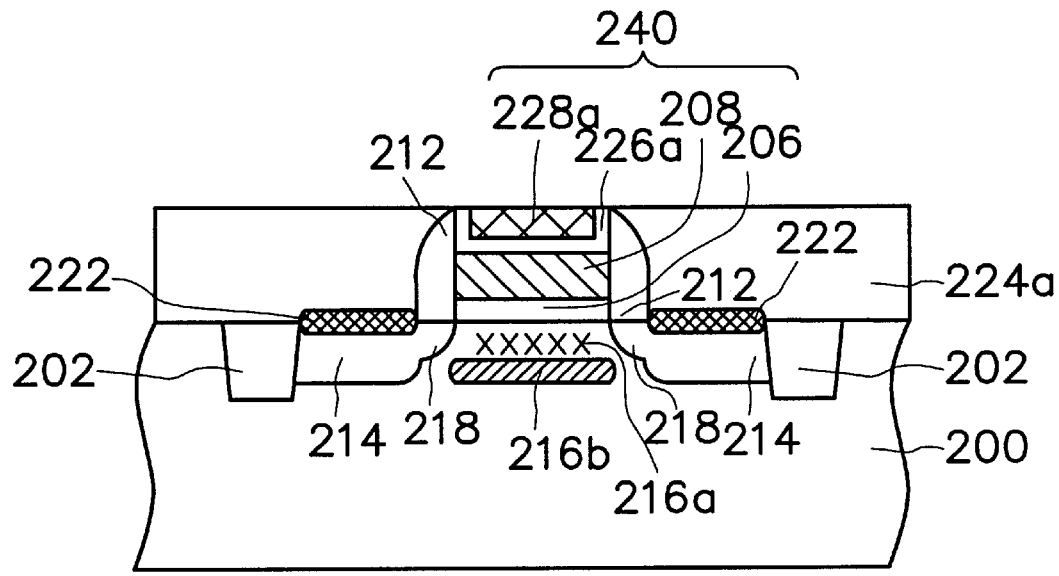

In FIG. 2G, a planarization process is performed to remove the conductive layer 228 and the barrier layer 226 so that the insulating layer 224a is exposed. The planarization process includes, for example, a chemical mechanical polishing (CMP) process, using the insulating layer 224a as a polishing stop. A remaining portion of the conductive layer 228 and the barrier layer 226 filled in the opening 230 respectively become a conductive layer 228a and a barrier layer 226a. A gate structure 240 of the invention therefore includes the gate oxide layer 206, the polysilicon layer 208, the barrier layer 226a, and the conductive layer 228a. In the formation of the gate structure 240, there is no etching process included. If the conductive layer 228a were formed by etching, an etching difficulty and an acid-tank contamination would be induced.

The rest fabrication processes are well known by the one skilled in the art, and are not further described here.

In conclusion, the invention has several characteristics as follows:

1. The invention introduces the self-aligned selective local implantation process so as to form the threshold-voltage doped region 216a and the anti-punch-through doped region 216b with a precise alignment with the gate structure 240. One extra mask is also saved so that fabrication cost is reduced.
2. The invention forms the conductive layer 228a of the gate structure 240 without including etching process, which may induce those conventional issue of difficult etching on the conductive layer and acid-tank contamination.
3. Each fabrication process used in the invention is compatible with the conventional fabrication process so that manufacturers can easily modify their production line.
4. The method of the invention for forming the MOS transistor is suitable for a high integration device.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a metal-oxide semiconductor (MOS) transistor on a semiconductor substrate, having an isolation structure to isolate the MOS transistor, the method comprising:

sequentially forming a gate oxide layer, a polysilicon layer, and a cap layer on the substrate so as to form a first-stage gate on the substrate;

forming an interchangeable source/drain region at each side of the first-stage gate in the substrate forming an insulating layer over the cap layer;

performing a planarization process to expose the cap layer;

removing the cap layer to form an opening that exposes the polysilicon layer;

performing a self-aligned selective local implantation process, using the insulating layer as a mask; and filling the opening with a conductive layer to form a gate structure on the substrate, wherein the conductive layer consequently replaces the cap layer of the first-stage gate structure, and wherein a preliminary conductive layer is formed over the substrate to fill the opening and a planarization process removes the preliminary conductive layer so that a remaining portion of the preliminary conductive layer is the conductive layer filling the opening.

2. The method of claim 1, wherein the step of filling the opening with the conductive layer further comprises:

forming a preliminary conductive layer over the substrate to fill the opening; and performing a planarization process to remove the preliminary conductive layer so that a remaining portion of the preliminary conductive layer is the conductive layer filling the opening to serve as a portion of the gate structure.

3. The method of claim 2, wherein the preliminary conductive layer further comprises a barrier layer, which is conformal to a top surface of the substrate.

4. The method of claim 3, wherein the preliminary conductive layer comprises copper.

5. The method of claim 4, wherein the barrier layer comprises Ta/TaN.

6. The method of claim 3, wherein the preliminary conductive layer comprises tungsten.

7. The method of claim 6, wherein the barrier layer comprises Ti/TiN.

8. The method of claim 3, wherein the planarization process comprises a chemical mechanical polishing (CMP) process.

9. The method of claim 1, wherein the step of performing the self-aligned selective local implantation process comprises forming a threshold-voltage doped region, which is used for adjusting a threshold voltage of the gate structure.

10. The method of claim 1, wherein the step of performing the self-aligned selective local implantation process comprises forming an anti-punch-through doped region.

11. The method of claim 1, wherein the step of removing the cap layer comprises a cap-layer etching process.

12. The method of claim 9 wherein the cap-layer etching process uses a proper selective etching ratio between the insulating layer and cap layer so that the cap layer can be etched without etching the insulating layer.

13. The method of claim 12 wherein the cap layer comprises silicon nitride.

14. The method of claim 12, wherein the cap layer comprises nitrogen silicon oxide.

15. The method of claim 12, wherein the insulating layer comprises silicon oxide.

16. The method of claim 1, wherein after the step of forming the interchangeable source/drain region, a self-aligned silicide (Salicide) process is further performed to form a Salicide layer on the interchangeable source/drain region.

17. The method of claim 16, wherein the Salicide process further comprises:

forming a metal layer over the substrate;

performing a thermal process to cause a reaction between silicon from the substrate and the metal layer; and removing the metal layer at a portion without reaction so that the Salicide layer is formed on the interchangeable source/drain region.

18. The method of claim 17, wherein the metal layer comprises titanium.

19. The method of claim 1, wherein the step of forming the interchangeable source/drain region further comprises:

lightly implanting ions into the substrate at each side of the first-stage gate structure;

forming a spacer on each sidewall of the first-stage gate structure; and using the first-stage gate structure and the spacer as an implantation mask, heavily implanting ions into the substrate to form the interchangeable source/drain region with a lightly doped drain (LDD) structure.

20. The method of claim 1, wherein the step of forming the spacer further comprises:

forming a preliminary insulating layer over the substrate; and performing an etching back process to remove the preliminary insulating layer so that a remaining portion of the preliminary insulating layer on each sidewall of the first-stage gate structure forms the spacer.

* * * * *